(12) United States Patent
Vankayala et al.

(10) Patent No.: US 10,770,116 B2
(45) Date of Patent: Sep. 8, 2020

(54) MEMORY DEVICE WITH A SIGNALING MECHANISM

(71) Applicant: Micron Technology, Inc., Boise, ID (US)

(72) Inventors: Vijayakrishna J. Vankayala, Allen, TX (US); Liang Chen, Allen, TX (US)

(73) Assignee: Micron Technology, Boise, ID (US)

( * ) Notice: Subject to any disclaimer, the term of this patent is extended or adjusted under 35 U.S.C. 154(b) by 0 days.

(21) Appl. No.: 16/446,876

(22) Filed: Jun. 20, 2019

(65) Prior Publication Data
US 2019/0348081 A1 Nov. 14, 2019

Related U.S. Application Data

(63) Continuation of application No. 15/976,737, filed on May 10, 2018, now Pat. No. 10,373,654.

(51) Int. Cl.
| *G11C 5/02* | (2006.01) |
|---|---|
| *G11C 5/06* | (2006.01) |
| *H01L 23/48* | (2006.01) |
| *H01L 25/065* | (2006.01) |
| *G11C 7/10* | (2006.01) |

(52) U.S. Cl.
CPC .............. *G11C 5/063* (2013.01); *G11C 5/02* (2013.01); *G11C 7/1048* (2013.01); *G11C 7/1057* (2013.01); *G11C 7/1063* (2013.01); *H01L 23/481* (2013.01); *H01L 25/0657* (2013.01); *G11C 7/1066* (2013.01); *H01L 2225/06541* (2013.01)

(58) Field of Classification Search
CPC ......... G11C 5/063; G11C 5/02; H01L 23/481; H01L 25/0657; H01L 2225/06541
USPC .......................................................... 365/51
See application file for complete search history.

(56) References Cited

U.S. PATENT DOCUMENTS

| 8,233,303 | B2 * | 7/2012 | Best | G11C 5/02 |
| | | | | 365/51 |
| 8,456,934 | B2 * | 6/2013 | Best | G11C 5/02 |
| | | | | 365/200 |
| 8,737,106 | B2 * | 5/2014 | Best | G11C 5/02 |
| | | | | 365/51 |
| 9,082,463 | B2 * | 7/2015 | Best | G11C 5/02 |
| 9,324,411 | B2 * | 4/2016 | Best | G11C 5/02 |
| 2010/0091537 | A1 * | 4/2010 | Best | G11C 5/02 |
| | | | | 365/51 |
| 2012/0182776 | A1 * | 7/2012 | Best | G11C 5/02 |
| | | | | 365/51 |
| 2012/0294058 | A1 * | 11/2012 | Best | G11C 5/02 |
| | | | | 365/51 |

(Continued)

*Primary Examiner* — Harry W Byrne
(74) *Attorney, Agent, or Firm* — Perkins Coie LLP

(57) ABSTRACT

A memory device includes active circuitry configured to process a segment set that corresponds to a source data, wherein: the source data comprises information corresponding to a device operation, the source data having a block length representing a number of bits therein, and the segment set includes at least a first segment and a second segment, the first segment and the second segment each including number of bits less than the block length; and a set of die pads coupled to the active circuitry and configured to communicate the segment set for operating a second device, wherein the set includes a number of die pads less than the block length.

23 Claims, 7 Drawing Sheets

(56) References Cited

U.S. PATENT DOCUMENTS

| | | | |
|---|---|---|---|
| 2014/0247637 A1* | 9/2014 | Best | G11C 5/02 365/51 |
| 2015/0332753 A1* | 11/2015 | Best | G11C 5/02 365/189.011 |
| 2016/0225431 A1* | 8/2016 | Best | G11C 5/02 |

* cited by examiner

MEMORY DEVICE WITH A SIGNALING MECHANISM

CROSS-REFERENCE TO RELATED APPLICATIONS

This application is a continuation of U.S. application Ser. No. 15/976,737, filed May 10, 2018, which is incorporated herein by reference in its entirety.

TECHNICAL FIELD

The disclosed embodiments relate to memory devices, and, in particular, to memory devices with a signaling mechanism.

BACKGROUND

Memory systems can employ memory devices to store and access information. The memory devices can include volatile memory devices, non-volatile memory devices, or a combination device. Memory devices, such as dynamic random access memory (DRAM), can utilize electrical energy to store and access data. Some memory devices can include vertically stacked dies (e.g., die stacks) that are connected using Through-Silicon-Vias (TSVs) in a master-slave (MS) configuration. For example, the memory devices can include Double Data Rate (DDR) RAM devices that implement DDR interfacing scheme for high-speed data transfer. The DDR RAM devices (e.g., DDR4 devices, DDR5 devices, etc.) can include memory chips that include die stacks that each include a master die and one or more slave dies.

Some memory device can include TSVs that are dedicated for data communication between dies. For example, DDR4 devices can include eight bidirectional TSVs, such as corresponding to a data bus associated with eight-bit data segments, configured to communicate data for reads and writes. Also, DDR5 devices can include 16 bidirectional TSVs that correspond to a data bus associated with 16-bit data segments.

With technological advancements in other areas and increasing applications, the market is continuously looking for faster and smaller devices. To meet the market demand, physical sizes or dimensions of the semiconductor devices are being pushed to the limit. In view of the ever-increasing commercial competitive pressures, along with growing consumer expectations and the desire to differentiate products in the marketplace, it is increasingly desirable that answers be found to these problems. Additionally, the need to reduce costs, improve efficiencies and performance, and meet competitive pressures adds an even greater pressure to find answers to these problems.

DETAILED DESCRIPTION

As described in greater detail below, the technology disclosed herein relates to memory devices, systems with memory devices, and related methods for communicating data signals between dies. The memory devices (e.g., DDR DRAMs) can reduce the number of die-pads and/or TSVs (e.g., DQ TSVs) dedicated for a data bus (e.g., DQ) based on breaking up communication segment and temporarily storing one or more portions using one or more latches. For example, for DDR4 interfaces, the memory devices can break up an eight-bit communication segment into two nibbles (e.g., four bit segments), four two-bit segments, etc. Instead of eight DQ TSVs, the memory devices can use a number (e.g., four, two, etc.) of DQ TSVs matching the reduced portions to separately/sequentially communicate the smaller portions of the communication segments. For DDR5 interfaces, the memory devices can break up a 16-bit communication segment into two bytes (e.g., eight bit segments), four nibbles, eight two-bit segments, etc. Accordingly, the memory devices can use a matching number of DQ TSVs instead of 16 DQ TSVs.

Figure 1:
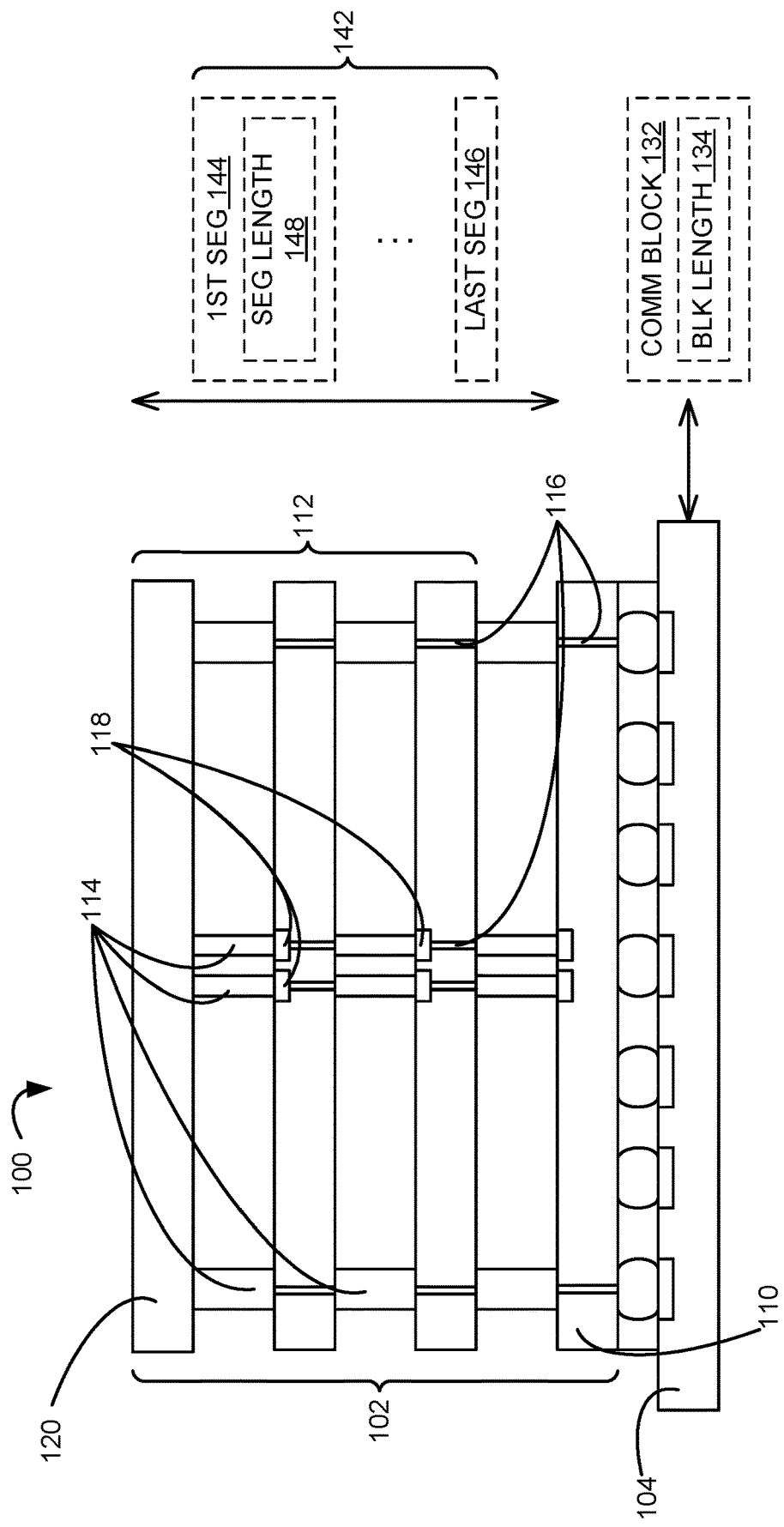
FIG. 1 is a cross-sectional view of a memory device in accordance with an embodiment of the present technology.

FIG. 1 is a block diagram of a memory device 100 (e.g., a semiconductor die assembly, including a three-dimensional integration (3DI) device or a die-stacked package) in accordance with an embodiment of the present technology. For example, the memory device 100 can include a memory device, such as a DRAM (e.g., DDR4 DRAM, DDR5 DRAM, etc.), or a portion thereof.

The memory device 100 can include one or more semiconductor dies (e.g., a die stack 102 including multiple dies) mounted on or connected to a substrate 104 (e.g., another die or a PCB). For example, the memory device 100 can include the die stack 102 having a master die 110 along with one or more slave dies 112. The master die 110 is configured to interact/interface with a component/device (e.g., a central processing unit (CPU) or a host device) of a system (e.g., a computing system or a memory system). The master die 110 can provide interactions or interface functions between the slave dies 112 and the system. For example, the master die 110 can receive commands and data from the system, and communicate the received commands and data to the appropriate die (e.g., itself or one of the slave dies 112). The master die 110 can communicate based on chip identification that accompanies the command.

The die stack 102 can include interconnects 114 between dies for facilitating die-to-die communications. The interconnects 114 can be electrically conductive structures (e.g., interconnect pillars, solder, etc.) resulting from a bonding or a joining process. The interconnects 114 can be connected to active circuits on the connected dies and/or through-silicon vias (TSVs) 116. The TSVs 116 can facilitate communications through corresponding dies or portions thereof. The dies can include die pads 118, such as conductive portions/locations on the dies, configured to provide electrical connections between the active circuits on the die and the external signaling structures (e.g., the interconnects 114, the TSVs 116, etc.).

Based on the interconnects 114, the TSVs 116, the die pads 118, etc., the master die 110 can communicate signals to/from a target die 120 (e.g., one of the slave dies 112) according to the chip identification. For example, the master die 110 can communicate signals corresponding to a read function or a write function associated with the target die 120.

For each function or operation (e.g., a read or a write), the master die 110 can communicate a communication block 132 (e.g., a predetermined grouping of data) with another device (e.g., CPU) of the memory/computing system. The communication block 132 can have a block length 134 representing a predetermined number of bits. For example, the block length 134 for a DDR4 communication block can be eight and 16 for a DDR5 communication block.

The memory device 100 (e.g., the master die 110) can break up or divide the communication block 132 into smaller segments for communication within the die stack 102. For example, the master die 110 can divide the communication block 132 into a segment set 142 including a first segment 144, a last or n-th segment 146, etc. Accordingly, the divided segments can have a segment length 148 that corresponds to a number of segments in the segment set 142. In some embodiments, the master die 110 can divide the eight-bit communication block into two four-bit segments (e.g., nibbles), four two-bit segments, etc. In some embodiments, the master die 110 can divide the 16-bit communication block into two eight-bit segments (e.g., bytes), four four-bit segments (e.g., nibbles), eight two-bit segments, etc. In some embodiments, the master die 110 can divide the communication block into a different number (e.g., three, five, seven, etc.) of segments.

Based on dividing the communication block 132 into the segment set 142, the die stack 102/the memory device 100 can include a reduced number of TSVs dedicated to the data communication or the corresponding data bus. The number of data TSVs within the die stack 102 can correspond to the segment length 148 instead of the block length 134. The reduction in the number of TSVs can provide reduction in the die size, improved/reduced power consumption, increased/improved layout spacing for the circuits, etc.

Figure 2:
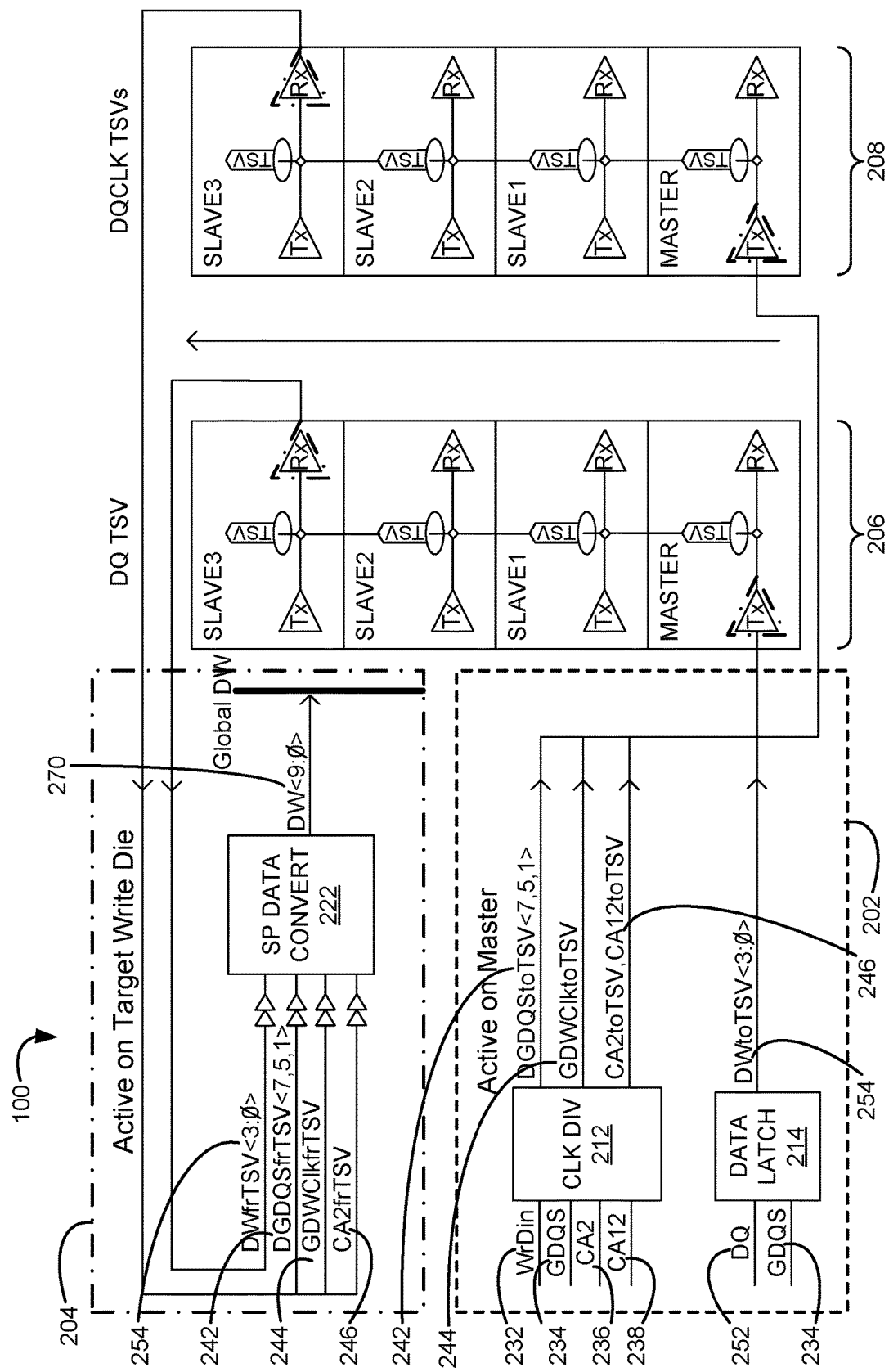
FIG. 2 illustrates a block diagram of a memory device for a write operation in accordance with an embodiment of the present technology.

FIG. 2 illustrates a block diagram of a memory device for a write operation in accordance with an embodiment of the present technology. FIG. 2 can illustrate a portion of the memory device 100 configured to process the write operation. For example, the master die 110 of FIG. 1 can include circuitry configured to divide the communication block 132 of FIG. 1, communicate/process the resulting segment set 142 of FIG. 1, or a combination thereof in implementing the write operation.

In some embodiments, the master die 110 can include a master-write divider 202 (e.g., circuit, firmware, software, etc.) configured to divide the communication block 132 for write operations. The master-write divider 202 can include a clock frequency divider 212 (e.g., a data strobe (DQS) frequency divider) configured to generate internal strobe signals (DQS/DQSCLK). The clock frequency divider 212 can receive and process one or more input signals, such as a write command 232 (WrDin), a data strobe 234 (GDQS), a first address 236 (CA2), a second address 238 (CA12), etc. The write command 232 can include a shifted write command corresponding to a write command from a host device. The data strobe 234 can include a strobe clock signal generated on the master die 110 for the data signal. The first address 236 can be generated on the master die 110 to specify a first portion of the divided information. The second address 238 can also be generated on the master die 110 to specify a second or an additional portion of the divided information.

Based on processing the input signals, the clock frequency divider 212 can generate one or more output signals, such as a strobe clock 242 (DGDQStoTSV<7,5,1>), an internal write indicator 244 (GDWClktoTSV), an address output 246 (CA2toTSV, CA12toTSV), etc. The strobe clock 242 can include a set of internal timing signals that correspond to the divided signal portions. The strobe clock 242 can correspond to the data strobe 234. The internal write indicator 244 can include an internal write command that correspond to the divided signal portions. The internal write indicator 244 can correspond to the write command 232, the divided portions, the corresponding timing, etc. the address output 246 can include the first address 236 and the second address 238.

In some embodiments, the master die 110 can include a data latch 214 (DinLat) configured to divide the intended write data into multiple portions and communicate them to the target die 120. For example, the data latch 214 can divide the communication block 132 or the write content thereof (e.g., a data signal 252 (DQ)) into two or more portions. The data latch 214 can divide according to the timing specified by the data strobe 234. After dividing, the data latch 214 can temporarily store or latch remaining portion(s) of the communication block 132 after one or more initial portions are communicated. Accordingly, the data latch 214 can generate a data write signal 254 (DWtoTSV). The data write signal 254 can include the divided segments. For example, the data write signal 254 can include a first segment including a first grouping of bits (e.g., bits 0-3 of an 8-bit data unit or bits 0-7 of a 16-bit data unit) in the data signal 252 communicated at a first time. The data write signal 254 can further include a second segment including a second or remaining grouping of bits (e.g., bits 4-7 or 8-15) in the data signal 252 communicated at a second time.

When the master die 110 is the target die 120 of FIG. 1 of the write operation, the master die 110 can perform the functions within itself and without communicating with other dies. When one of the slave dies 112 of FIG. 1 is the target die 120 of the write operation, the master-write divider 202 and a corresponding target-write converter 204 can communicate information (e.g., output signals from the master-write divider 202) through a data communication circuit 206, a data-clock communication circuit 208, etc. The data communication circuit 206 can be configured to communicate write data, and the data-clock communication circuit 208 can be configured to communicate other associated information, such as write address, write indicator, clock signal, command, etc. For example, the data communication circuit 206 can communicate the data write signal 254 from the master die 110 to the target die 120. Also, the data-clock communication circuit 208 can communicate the strobe clock 242, the internal write indicator 244, the address output 246, etc. from the master die 110 to the target die 120.

The data communication circuit 206, the data-clock communication circuit 208, etc. can each include a set of designated TSVs in the master die 110 and the target die 120. The TSVs can be for communicating designated signals. In some embodiments, the data communication circuit 206, the data-clock communication circuit 208, etc. can also each include a transmitter, a receiver, etc. corresponding to each of the dies, signals, etc.

Each of the slave dies 112 of FIG. 1, including the target die 120 of FIG. 1, can include the target-write converter 204 (e.g., circuit, firmware, software, etc.) configured to process the segment set 142 and rebuild the communication block 132 for write operations. The target-write converter 204 can receive the signals sent through the data communication circuit 206, the data-clock communication circuit 208, corresponding data buses, etc. For example, the target-write converter 204 can receive the data signal 252, the strobe clock 242, the internal write indicator 244, the address output 246, etc. through the designated TSVs and corresponding data buses.

In some embodiments, the target-write converter 204 can include a parallel data converter 222 (DDgen10), such as a serial-to-parallel converter, configured to convert the communicated segments back into the communication block 132 or a data portion thereof. For example, the parallel data converter 222 can use the received signals to combine the first segment (e.g., bits 0-3 or 0-7) and the second segment (e.g., bits 4-7 or 8-15), communicated in series or at different times, of the data signal 252 and generate a data write output 270 (DW<9:0>). Based on combining the segments, the target-write converter 204 can rebuild the original content as one unit of data (e.g., bits 0-7 for 8-bit data units or bits 0-15 for 16-bit data units). The parallel data converter 222 can receive and combine/sequence the received segments according to the strobe clock 242 (e.g., synchronization indicator), the internal write indicator 244 (e.g., enable indicator), the address output 246 (e.g., a data sequence/order indicator), etc.

For illustrative purposes, FIG. 2 shows the master die 110 dividing an 8-bit data unit into two nibbles (e.g., two 4-bit units) and communicating the two nibbles at separate times. However, it is understood that the master die 110 can divide data having different unit lengths (e.g., 10-bit units, 16-bit units, 32-bit units, etc.). It is also understood that the master die 110 can divide the data into three or more segments.

In some embodiments, as shown in FIG. 2, the master die 110 can communicate information for a Cyclic Redundancy Check (CRC) write. For example, for the 8-bit data communications (e.g., DDR4), the master die 110 can send CRC data (e.g., two additional bits) following the first and second segments (e.g., nibbles). Accordingly, the target die 120 can receive and reconstruct the data output 270 having 10 bits as illustrated by "DW <9:0>."

As an illustrative example, the master die 110 can capture the data (e.g., the data signal 252) using a setup-and-hold latch within the data latch 214 and capture the write command (e.g., the data strobe 234) in the DQS frequency divider 212. Such operation can be timing critical. After capturing the data and the write command, the master die 110 (e.g., the DQS frequency divider 212 and/or the data latch 214) can convert a full unit (e.g., an 8-bit unit, a 16-bit unit, etc.) of serial data into a set (e.g., two) of smaller parallel segments (e.g., two 4-bit segments (nibbles), two 8-bit segments (bytes), etc.). The master die 110 can send the parallel segments though the DQ TSV. For CRC writes (BL10), the CRC information (e.g., the final two bits) can be sent after the initial two segments. The master die 110 can further generate and communicate the strobe clock 242, the first address 236, the second address 238, etc. that can be used to latch the data in the parallel data converter 222 in the target-write converter 204. These signals (e.g., the strobe clock 242, the first address 236, the second address 238, etc.) can be communicated to the target die 120 using matching paths/corresponding TSVs. Once the communicated data is received at the target die 120, the corresponding parallel data converter 222 can latch the received data according to the strobe clock 242 and/or the internal write indicator 244. The parallel data converter 222 can use the latched data to convert the serially communicated segments (e.g., the first segment, the second segment, the CRC segment, etc.) into parallel data write output 270. Accordingly, the DQS frequency divider 212 can remain active only on the master die 110, the parallel data converter 222 can remain active on the target die 120, and the global data lines can toggle only on the target die 120.

Communicating the data in multiple (e.g., two) serial segments can be implemented using the same number of gates as communicating in a full parallel configuration. Based on the matching gate count, communicating the data unit in two sequential segments can reduce the number of TSVs without impacting a write recovery delay (e.g., a required delay before being able to issue a precharge to the same previously written page).

Figure 3:
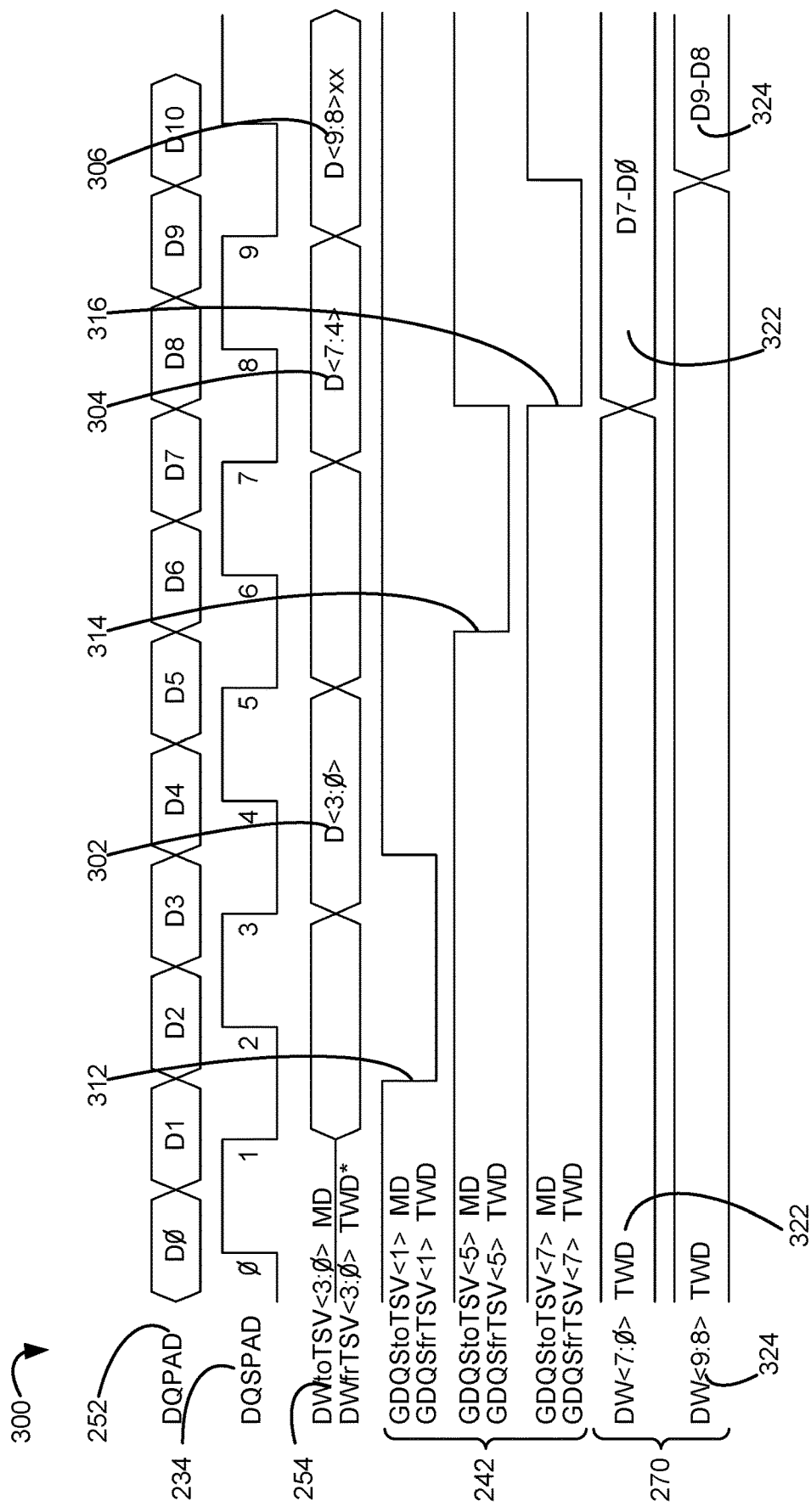
FIG. 3 illustrates a timing diagram for the write operation in accordance with an embodiment of the present technology.

FIG. 3 illustrates a timing diagram 300 for the write operation in accordance with an embodiment of the present technology. The timing diagram 300 can correspond to the input/output signals of the master-write divider 202 of FIG. 2, the target-write converter 204 of FIG. 2, etc. For example, the timing diagram 300 can illustrate the data signal 252, the data strobe 234, the data write 254, the strobe clock 242, the data write output 270, etc., and a temporal relationship between the illustrated signals.

In some embodiments, the master die 110 of FIG. 1 can communicate a first write segment 302, a second write segment 304, a CRC segment 306, or a combination thereof through the data write 254. For example, the first write segment 302 can include bits 0-3 of an 8-bit communication unit or bits 0-7 of a 16-bit communication unit, and the second write segment 304 can include the remaining bits 4-7 or bits 8-15. Also, the CRC segment 306 can include CRC information (e.g., two bits of CRC information) corresponding to the communication unit. The master die 110 can generate and communicate the first write segment 302 initially, then communicate the second write segment 304, and then communicate the CRC segment 306. In some embodiments, the first write segment 302, the second write segment 304, and the CRC segment 306 can be communicated through one set of TSVs.

Communication of the first write segment 302, the second write segment 304, the CRC segment 306, etc. can correspond in time with the strobe clock 242. For example, the master die 110 can generate the strobe clock 242 including a first trigger 312, a second trigger 314, a third trigger 316, (e.g., first, second, and third pulses) etc. that correspond to the first write segment 302, the second write segment 304, the CRC segment 306, respectively. In some embodiments, the first trigger 312 can precede and/or overlap with the first write segment 302, the second trigger 314 can precede and/or overlap with the second write segment 304, the third trigger 316 can precede and/or overlap with the CRC segment 306, etc. In some embodiments, the first trigger 312, the second trigger 314, the third trigger 316, etc. can be communicated through one set of TSVs, such as for serial communication of the strobe clock 242. In some embodiments, the first trigger 312, the second trigger 314, the third trigger 316, etc. can each be communicated through a corresponding/dedicated TSV(s), such as for parallel communication of the strobe clock 242.

The parallel data converter 222 can receive and process the various segments (e.g., the first write segment 302, the second write segment 304, the CRC segment 306, etc.) according to the corresponding pulses (e.g., the first trigger 312, the second trigger 314, the third trigger 316, etc.). In some embodiments, the parallel data converter 222 can latch one or more of the first-received segments (e.g., the first write segment 302 and/or the second write segment 304) according to the pulses. Also according to the pulses, the parallel data converter 222 can recombine, such as from serial arrangement of received data into a parallel arrangement of the data, the first trigger 312 and the second trigger 314 to generate a regenerated content 322. In some embodiments, the parallel data converter 222 can separately generate a regenerated CRC 324.

As an illustrative example, the master-write divider 202 can use n (e.g., two) clock cycles to load the information and further use n clock cycles to send the first write segment 302 instead of the 2n (e.g., four) clock cycles that would be needed to send the full/undivided data content. The parallel data converter 222 can capture the first write segment 302 after the first pulse 312 begins, capture the second write segment 304 after the second pulse 314 begins, capture the CRC segment 306 after the third pulse 318 begins. The parallel data converter 22 can further generate/communicate the regenerated content 322 when the second pulse 314 ends and/or when the third pulse 318 begins. Similarly, the parallel data converter 22 can generate/communicate the regenerated CRC 324 when the third pulse 318 ends.

Figure 4:
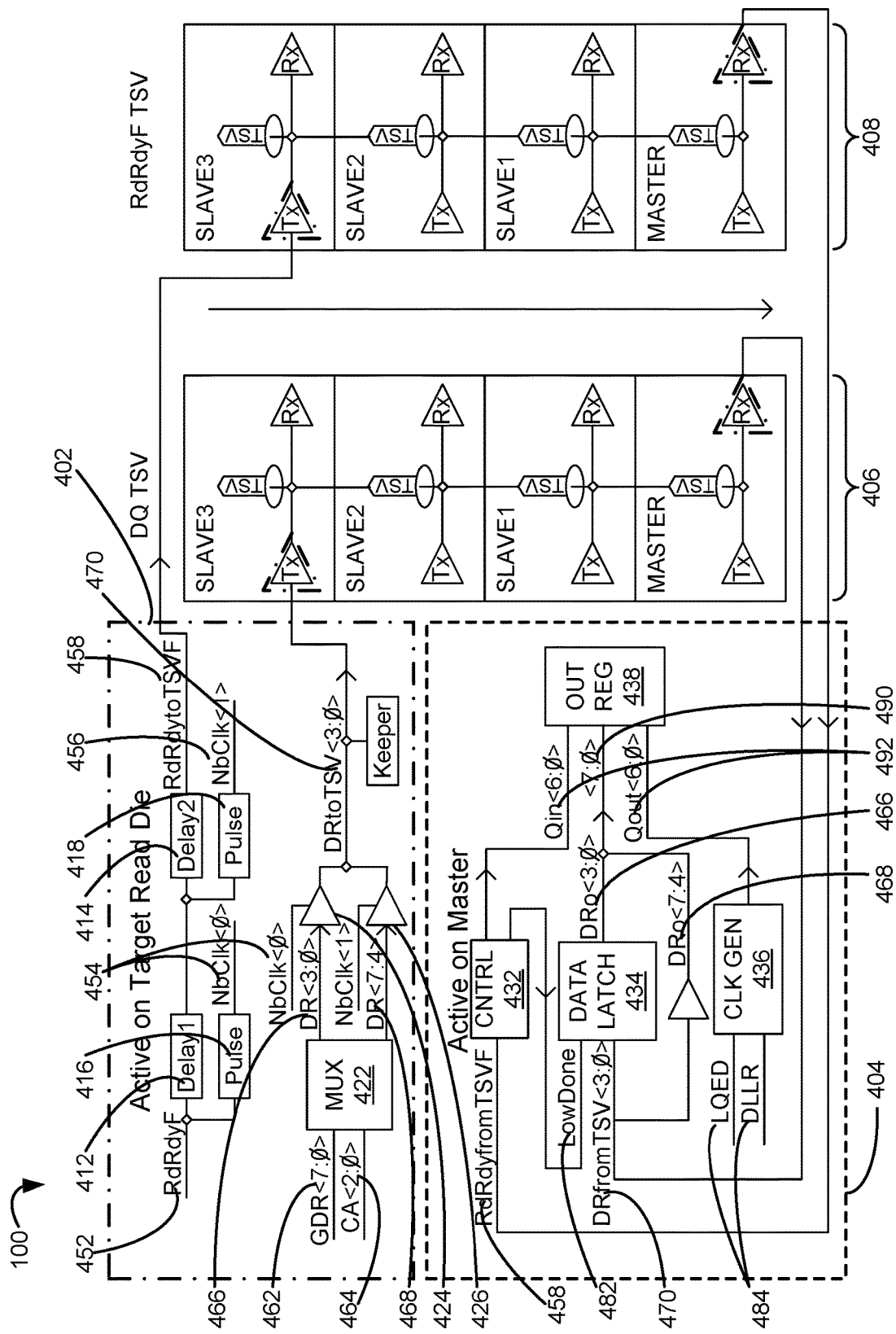
FIG. 4 illustrates a block diagram of a memory device for a read operation in accordance with an embodiment of the present technology.

FIG. 4 illustrates a block diagram of a memory device for a read operation in accordance with an embodiment of the present technology. FIG. 4 can illustrate a portion of the memory device 100 configured to process the read operation. For example, the target die 120 can include circuitry configured to read the stored data and divide the read results, communicate/process the divided read results, or a combination thereof in implementing the read operation. Also, the master die 110 can include circuitry configure to receive the divided segments, re-combine the segments, or a combination thereof.

The target die 120 can include circuitry (not shown) configured to locate and read the stored information. The target die 120 (e.g., the die having the target content stored thereon) can further include a target-read block 402 (e.g., circuit, firmware, software, etc.) configured to divide a read result for read operations. The target-read block 402 can include a set of circuits/functions/modules/etc. configured to generate timing signals for communicating information between dies. For example, the target-read block 402 can include a first delay 412, a second delay 414, a first generator 416 (e.g., a pulse/signal generator), a second generator 418 (e.g., a pulse/signal generator), etc. The first delay 412 can receive and delay an internal/initial read ready signal 452 (e.g., RdRdyF for inverted read ready signal). The initial read ready signal 452 can further drive the first generator 416 to generate a first segment clock 454 (NbClk<0>). The delayed output of the first delay 412 can be provided as inputs for the second delay 414 and the second generator 418. The second delay 414 can further delay the incoming signal and generate a read ready output 458 (RdRdytoTSVF) as a read ready indicator for internal die-to-die communication. Also based on the output of the first delay 412, the second generator 418 can generate a second segment clock 456 (NbClk<1>).

The target-read block 402 can further include a set of circuits/functions/modules/etc. configured to divide a read result for die-to-die communication. For example, the target-read block 402 can include a multiplexer 422, a first transmitter 424, a second transmitter 426, etc. The multiplexer 422 can receive read data 462 (GDR <7:0>) resulting from the read operation and further receive a read address 464 (CA <2:0>) representing a storage/read location corresponding to the read address 464. The multiplexer 422 can divide the read data 462 into segments, such as a first read segment 466 (DR <3:0>), a second read segment 468 (DR <7:4>), etc. The first read segment 466 can be provided as an input to the first transmitter 424, and the second read segment 468 can be provided as an input to the second transmitter 426. The first transmitter 424 can further receive the first segment clock 454 as a triggering input, and the second transmitter 426 can receive the second segment clock 456 as a triggering input. Accordingly, the target-read block 402 can generate and send a read output 470 including the first read segment 466 and the second read segment 468 at different times.

Similar to the write operation and associated circuits, it is understood that the target-read block 402 can process the read data 462 having various unit lengths (e.g., 8-bit units, 10-bit units, 16-bit units, etc.). Further, it is understood that the target-read block 402 can divide the read data 462 into 3 or more segments.

The target die 120 of the read operation is one of the slave dies 112 of FIG. 1, it can divide the read result and communicate the resulting information (e.g., the read output 470, the read ready output 458, etc.) through a data communication circuit 406, a ready communication circuit 408, etc. The data communication circuit 406 can be configured to communicate the divided read segments, and the ready communication circuit 408 can be configured to communicate other associated information, such as write address, write indicator, clock signal, command, etc. For example, the data communication circuit 406 can communicate the read output 470 from the target die 120 to the master die 110. Also, the ready communication circuit 408 can communicate the read ready output from the target die 120 to the master die 110.

The data communication circuit 406, the ready communication circuit 408, etc. can each include a set of designated TSVs in the master die 110 and the target die 120. The TSVs can be for communicating designated signals. In some embodiments, the data communication circuit 406, the ready communication circuit 408, etc. can also each include a transmitter, a receiver, etc. corresponding to each of the dies, signals, etc.

The master die 110 can include a master-read block 404 (e.g., circuit, firmware, software, etc.) configured to process the segment set 142 of FIG. 1 (e.g., the first read segment 466, the second read segment 468, etc. of the read output 470) and rebuild the read data 462, such as for the communication block 132 of FIG. 1. The master-read block 404 can receive the signals sent through the data communication circuit 406, the ready communication circuit 408, corresponding data buses, etc. For example, the master-read block 404 can receive the read output 470, the read ready output 458, etc. through the designated TSVs and corresponding data buses.

In some embodiments, the master-read block 404 can include a data bus controller 432 (DBGcntrl), a data latch 434, a clock generator 436 (DOutClkGen), an output register 438 (DROutFIFO), etc. The data bus controller 432 can be configured to control reception/timing of the serially communicated segments. For example, the data bus controller 432 can receive the read ready output 458 to process timing associated with receiving and recombining the segments (e.g., the first read segment 466, the second read segment 468, etc.). The data latch 434 can be configured to latch or temporarily store one or more of the serially communicated segments. For example, the data latch 434 can receive the read output 470 and store initially communicated segments (e.g., the first read segment 466) therein. The data latch 434 can receive and store based on the timing control from the data bus controller 432 (e.g., a first segment trigger 482 (LowDone)). When the last of the segments (e.g., the second read segment 468) are received by the master-read block 404, it can be combined with the first read segment 466. For example, the data latch 434 can send the latched segment (e.g., the first read segment 466) when the latter/last segment (e.g., the second read segment 468) is received. The master-read block 404 can combine the segments into a combined read output 490 that mirrors/matches the read data 462.

The master-read block 404 can load the combined read output 490 into the output register 438. The output register 438 (e.g., FIFO register) can be configured to receive and temporarily hold the combined read output 490. The output register 438 can further communicate the combined read output 490 as the communication block 132 of FIG. 1 from the master die 110 to other components (e.g., CPU) external to the memory device 100. For example, the master-read block 404 can load the combined read output 490 into the output register 438 and/or send the communication block 132 (e.g., the combined read output 490) according to timing signals 492 (e.g., Qin, Qout, etc.). In some embodiments, the output register 438 can receive/load the combined read output 490 according to an output (e.g., Qin) from the data bus controller 432. In some embodiments, the clock generator 436 can receive clock inputs 484 (e.g., LQED, DLLR, etc.) and generate a transmitting trigger (e.g., Qout). The clock inputs 484 can include a read information that is shifted by a read latency (LQED), a DLL clock signal (DLLR), etc.

As an illustrative example, the target die 120 can generate the read result (e.g., the read data 462) by performing a burst ordering process according to the read address 464. The target-read block 402 can convert the read result into (e.g., an 8-bit unit, a 16-bit unit, etc.) of serial data into a set (e.g., two) of smaller parallel segments (e.g., two 4-bit segments (nibbles), two 8-bit segments (bytes), etc.) according to the control signals (e.g., the first segment clock 454, the second segment clock 456, etc.). The target die 120 can send the parallel segments through the DQ TSV to the master die 110. Based on receiving the first of the segments, the master die 110 can generate the first segment trigger 482 to control the data latch 434 and store the first read segment 466. When the second read segment 468 becomes available on the master die 110, the read data can be converted back to the full unit (e.g., the 8-bit unit, the 16-bit unit, etc.) for the read output 470. The conversion back to the full unit can be performed using the output register 438.

In some embodiments, the conversion can be performed in/during a sample window (tCCD) cycle. The timing for the first read segment 466 can be controlled by a fixed delay that is at least half of the sample window cycle (e.g., minimum 1/2 tCCD cycle). The data latch 434 can be initially open for the first read segment 466 to pass through. The latch timing signal (e.g, the Qin latching DRo<7:0>) can be controlled by a read clock (RdClk) signal, which goes through a similar TSV path as the latch timing signal.

Communicating the data in multiple (e.g., two) serial segments can be implemented using the same number of gates as communicating in a full parallel configuration. Based on the matching gate count, communicating the data unit in two sequential segments can reduce the number of TSVs without impacting a recovery delay.

Figure 5:
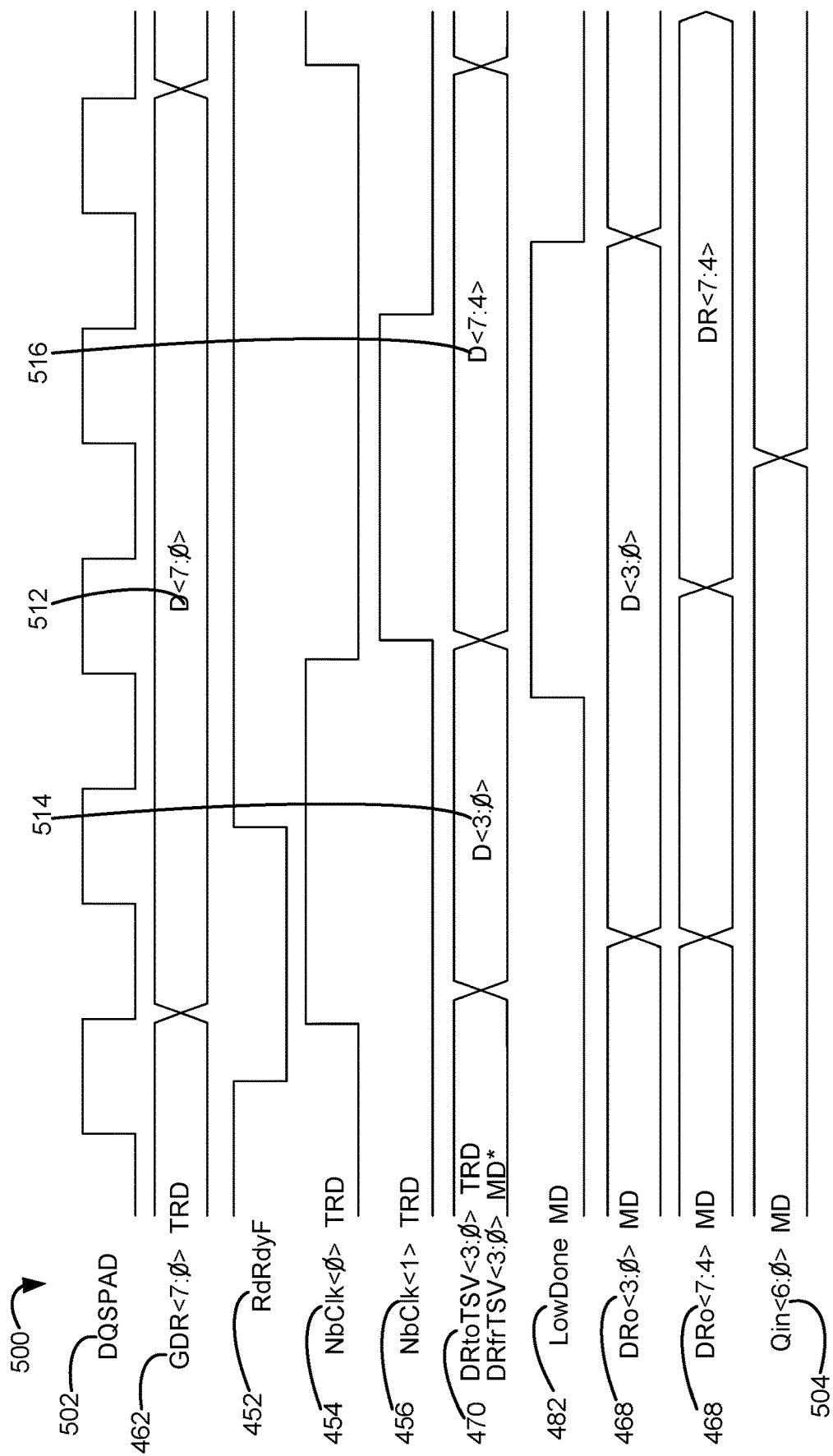
FIG. 5 illustrates a timing diagram for the read operation in accordance with an embodiment of the present technology.

FIG. 5 illustrates a timing diagram 500 for the read operation in accordance with an embodiment of the present technology. The timing diagram 500 can correspond to the input/output signals of the target-read block 402 of FIG. 4, the master-read block 404 of FIG. 4, etc. For example, the timing diagram 500 can illustrate the read data 462, the initial read ready 452, the first segment clock 454, the second segment clock 456, the read output 470, the first segment trigger 482, the first read segment 466, the second read segment 468, etc., and a temporal relationship between the illustrated signals.

The memory device 100 of FIG. 1 can operate according to a data strobe (DQSPAD) 502. The data strobe 502 can be similar to the data strobe 234 of FIG. 2, and provide a clock signal/frequency for the master die 110 of FIG. 1, the target die 120 of FIG. 1, etc.

According to the data strobe 502, the memory device 100 (e.g., the target die 120) can generate/provide a read content 512 as the read data 462. For example, the target die 120 can access and read voltage levels at a storage location to generate the read content 512. As the read content 512 is read and becomes available for other circuits, the memory device 100 (e.g., the target die 120) can generate the initial read ready 452.

From the read content 512, the memory device 100 (e.g., the multiplexer 422 of FIG. 4 of the target die 120) can generate the first read segment 466, the second read segment 468, etc. For example, the multiplexer 422 can divide the read content 512 into two halves, such as bits 0-3 and 7-4 for an 8-bit data unit or bits 0-7 and 8-15 for a 16-bit data unit.

The memory device 100 can communicate the generated segments can be communicated between its dies, such as between the target die 120 and the master die 110. The memory device 100 can communicate the first read segment 466, the second read segment 468, etc. based on corresponding clock/trigger signals (e.g., the first segment clock 454, the second segment clock 456, etc.). For example, the pulse generators 416 and 418 of FIG. 4 can generate the first segment clock 454 and the second segment clock 456 based on the initial read ready 452, the first delay 412, or a combination thereof. The first segment clock 454 can include a timing pulse that begins as the read data 462 is read or becomes available. The second segment clock 456 can also include a timing pulse that begins when the timing pulse of the first segment clock 454 ends.

According to or along with the clock/trigger signals (e.g., the first segment clock 454, the second segment clock 456, etc.), the memory device 100 (e.g., the target die 120) can communicate the segmented data (e.g., the first read segment 466, the second read segment 468, etc.) between dies therein. For example, the target die 120 can generate/communicate a first portion 514 (e.g., the first read segment 466) through the read output 470 according to the timing pulse of the first segment clock 454. Similarly, the target die 120 can generate/communicate the a second portion 516 (e.g., the second read segment 468) through the read output 470 according to the timing pulse of the second segment clock 456.

As part of the die-to-die communication, the master die 110 can receive the segmented data. For example, the data bus controller 432 of FIG. 4, the data latch 434 of FIG. 4, etc. of the master-read block 404 can receive the first read segment 466, the second read segment 468, etc. In some embodiments, the master-read block 404 can receive the first read segment 466, the second read segment 468, etc. according to the read ready output 458 of FIG. 4. As the segments are received, the master-read block 404 (e.g., the data latch 434) can generate the combined read output 490 of FIG. 4 accordingly. For example, the data latch 434 can latch the first read segment 466 and make it available on a corresponding portion of the bus for the combined read output 490. When received, the second read segment 468 can be routed on a corresponding portion of the bus for the combined read output 490. Further, the data bus controller 432 can generate a register input signal 504 (Qin) based on receiving the second read segment 468 and the corresponding read ready output 458. The master die 110 can load the combined read output 490 into the output register 438 of FIG. 4 according to the register input signal 504.

For illustrative purposes, the memory device 100 is described above as recombining the data at the target die 120 for the write operation, and correspondingly, dividing the read data at the target die 120 for the read operation. However, it is understood that the memory device 100 can operate without the recombining/dividing operation at the target die 120. For example, the target die 120 can store and recall/access the segments as separate segments. The segments can be stored/accessed according to a predetermined sequence, such as a sequence based on specific/tied storage locations, address links/pointers, etc.) without the recombining/dividing operation. As discussed above, the master die 110 can split the source data into the segments for the write, and recombine the segments for the read.

Figure 6:
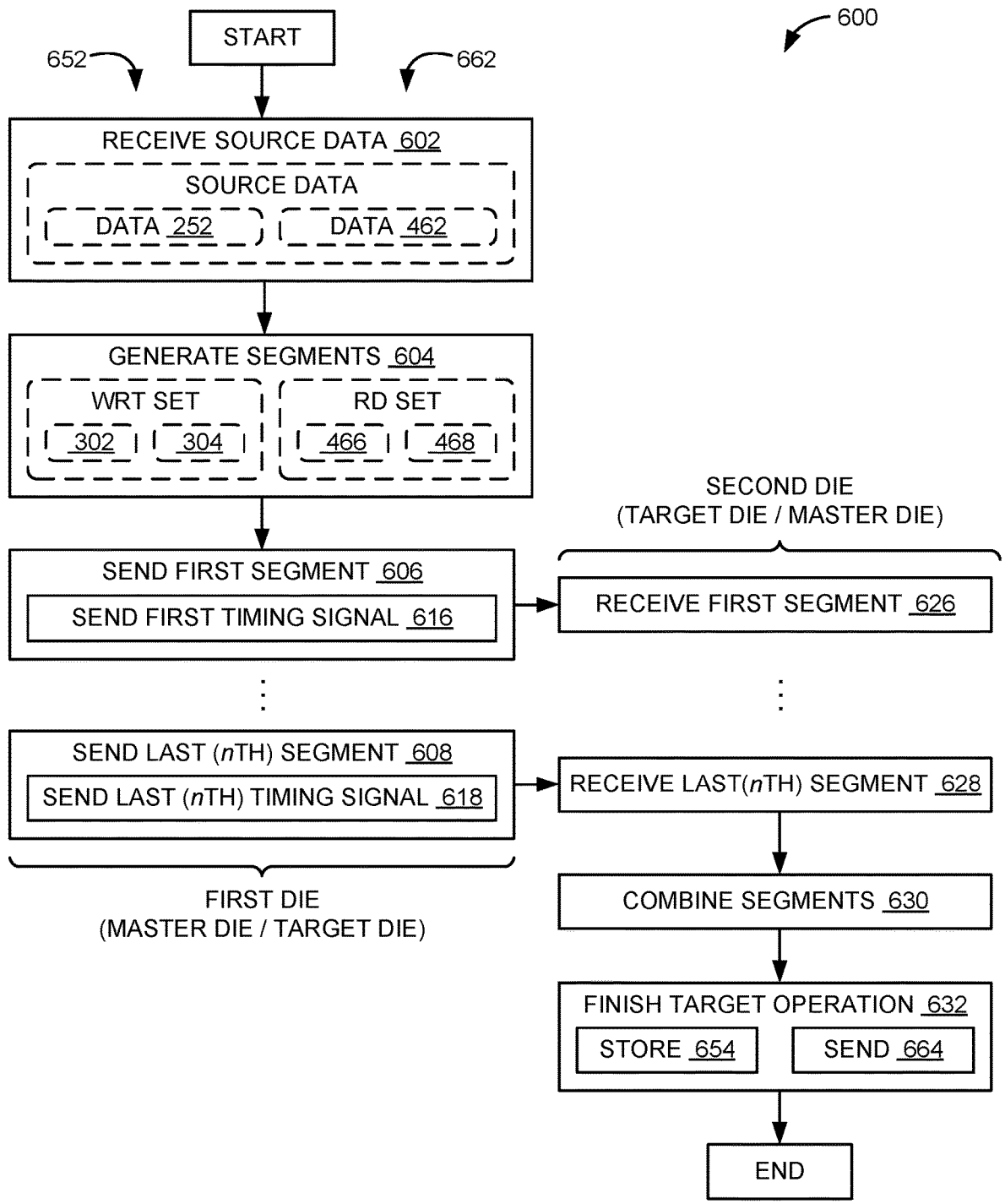
FIG. 6 illustrates a flow diagram illustrating an example method of operating the memory device of FIG. 1 in accordance with an embodiment of the present technology.

FIG. 6 illustrates a flow diagram 600 illustrating an example method of operating the memory device 100 of FIG. 1 in accordance with an embodiment of the present technology. The example method can be for operating the master die 110 of FIG. 1 (e.g., the master-write divider 202 of FIG. 2, the master-read block 404 of FIG. 4, etc.), the target die 120 of FIG. 1 (e.g., the target-write converter 204 of FIG. 2, the target-read block 402 of FIG. 4), etc. Further, the example method can correspond to the timing diagram 300 of FIG. 3, the timing diagram 500 of FIG. 5, etc. The example method can illustrate the memory device 100 performing a write operation 652 and/or a read operation 662.

At box 602, the memory device 100 can receive the source data (e.g., the data signal 252 for the write operation 652 or the read data 462 for the read operation 662). For example, for the write operation 652, the master die 110 can receive the communication block 132 of FIG. 1, which includes the write content (e.g., the data signal 252), from an external device/component (e.g., system controller, CPU, etc.). Also, for the read operation 662, the target die 120 can read/retrieve the data (e.g., the read data 462) stored at a location specified by the received communication block 132. In both cases, the received source data can correspond to the block length 134 of FIG. 1 (e.g., 8 bits for DDR4 or 16 bits for DDR5).

At box 604, the memory device 100 can generate data segments from the source data. The memory device 100 can generate the segment set 142 of FIG. 1 based on dividing the source data into an n number of segments. As illustrated in FIGS. 2-3 (e.g., illustrating n=2), the master die 110 can generate the segment set 142 that includes the first write segment 302 and the second write segment 304 for the write operation 652. As illustrated in FIGS. 4-5 (e.g., illustrating n=2), the target die 120 can generate the segment set 142 that includes the first read segment 466 and the second read segment 468 for the read operation 662.

In some embodiments, the segments (e.g., the first segment 144 of FIG. 1, the second segment, the last segment 146 of FIG. 1, etc.) can have equal length/size. Accordingly, each segment can have a length/size that corresponds to $$\frac{(\text{block length})}{n}.$$

For example, for a two-segment set (i.e., n=2), the first write segment 302, the second write segment 304, the first read segment 466, the second read segment 468, etc. can each include four bits (e.g., a nibble) for DDR4 or eight bits (e.g., a byte) for DDR5. In some embodiments, the segment set 142 can further include data supplementary to the content data. For example, the segment set 142 can include the CRC segment 306 of FIG. 3.

After generating the segments, the memory device 100 can internally communicate the segments between its memory dies, such as between the master die 110 and the target die 120. The memory device 100 can communicate the segments using the TSVs 116 of FIG. 1 designated for such purpose. In some embodiments, the memory device 100 can communicate all bits within each of the segments in parallel. The memory device 100 can further communicate the segments in series. As such, the memory device 100 can include a quantity of the dedicated TSVs that correspond to the segment length (e.g., matching the length of the longest segment) instead of the block length 134. For the n=2 example, the memory device 100 can include four (i.e., instead of eight) dedicated TSVs for DDR4 or eight (i.e., instead of 16) dedicated TSVs for DDR5.

To illustrate the communication sequence, the memory device 100 can send the first segment as shown at box 606. For example, for the write operation 652, the master die 110 can send the first write segment 302 to the target die 120 through the dedicated TSVs. Also, for the read operation 662, the target die 120 can send the first read segment 466 to the master die 110 through the dedicated TSVs. All of the bits in the segment can be sent simultaneously/in parallel through the corresponding number of TSVs.

In sending the first segment, the memory device 100 can send a first timing signal as illustrated at box 616. For example, for the write operation 652, the master die 110 can generate/send the first pulse 312 of FIG. 3 to the target die 120. Also, for the read operation 662, the target die 120 can generate/send the read ready output 458 corresponding to the first segment clock 454 of FIG. 4 to the master die 110. In some embodiments, the first timing signal can function as an enable signal or a trigger for allowing the receiving device to receive the first segment.

In response, at box 626, the receiving die (e.g., the target die 120 for the write operation 652 or the master die 110 for the read operation 662) can receive the sent first segment. The receiving die can receive the information based on the first timing signal. For example, the receiving die detects the first timing signal, it can load the information/voltage levels on the dedicated TSVs and/or the corresponding bus to a register/latch (e.g., the data converter 222 of FIG. 2 or the data latch 434 of FIG. 4).

The memory device 100 can repeat the sending/receiving operation to communicate a different/subsequent segment. Accordingly, as illustrated at box 608, the memory device 100 can send the last of the segments (e.g., the nth segment and/or the CRC segment). For the n=2 example, the master die 110 can send the second write segment 304 to the target die 120 for the write operation 652. Also for the n=2 example, the target die 120 can send the second read segment 468 to the master die 110 for the read operation 662. All of the bits in the segment can be sent simultaneously/in parallel through the corresponding number of TSVs. At box 618, the memory device 100 can also send the last (e.g., the nth) timing signal to coordinate communication of the last segment. At box 628, the receiving die can receive the last segment similarly as the first segment.

At box 630, the memory device 100 can combine the received segments after receiving the last of the segments. For example, for the write operation 652, the target die 120 (e.g., the data converter 222) can combine the first write segment 302 and the second write segment 304 to generate the data write output 270 of FIG. 2. Also, for the read operation 662, the master die 110 (e.g., the data latch 434) can combine the first read segment 466 and the second read segment 468 to generate the combined read output 490 of FIG. 4. The memory device 100 can combine the segments according to a predetermined sequence (e.g., the received order). In doing so, the receiving die can recreate the original source data based on combining the received segments.

At box 632, the memory device 100 can finish the targeted operation. For example, at box 654, the target die 120 can complete the write operation 652 based on storing the data write output 270 at the corresponding storage location. Also, at box 664, the master die 110 can complete the read operation 662 based on communicating the combined read output 490 to the external device (e.g., host device, system controller, CPU, etc.) that requested the read. Accordingly, the master die 110 can generate the Qout timing signal for the external communication, such that the content (i.e., the combined read output 490) of the output register 438 can be read/accessed by the external device.

Figure 7:
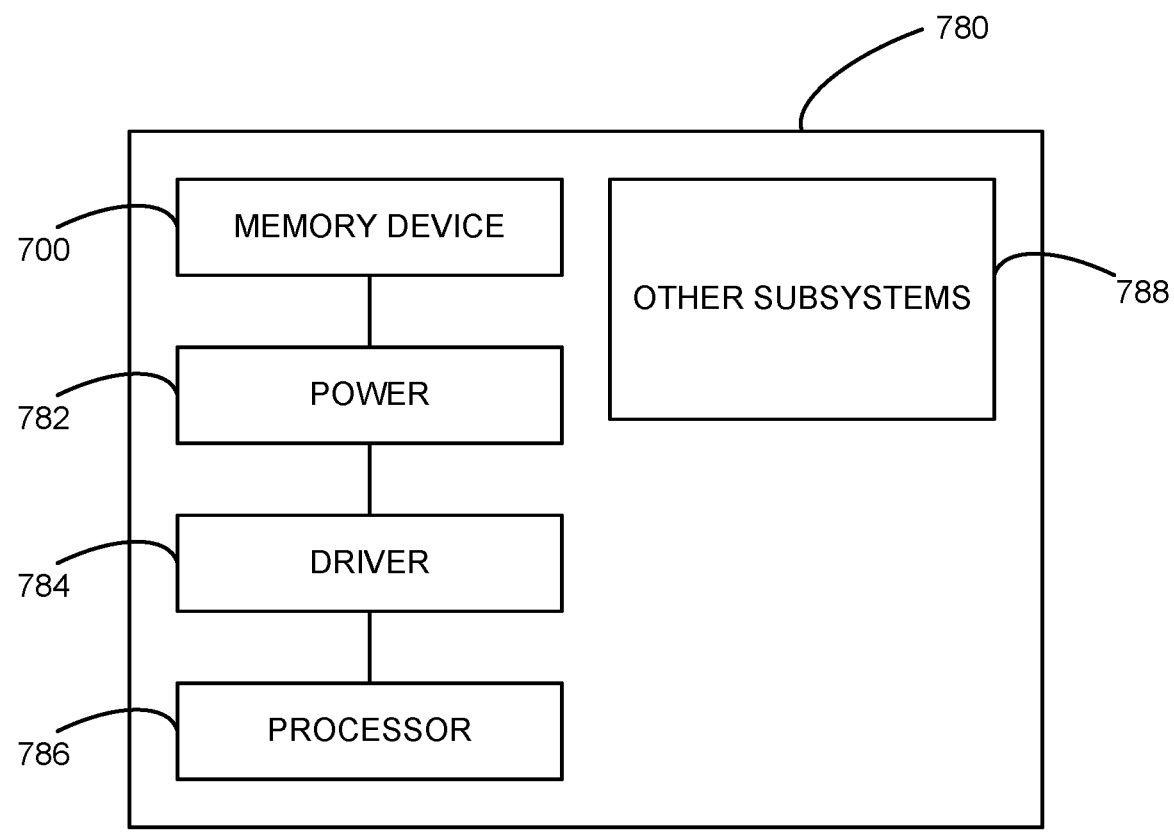
FIG. 7 is a schematic view of a system that includes a memory device in accordance with an embodiment of the present technology.

FIG. 7 is a schematic view of a system that includes a memory device in accordance with embodiments of the present technology. Any one of the foregoing memory devices described above with reference to FIGS. 1-6 can be incorporated into any of a myriad of larger and/or more complex systems, a representative example of which is system 780 shown schematically in FIG. 7. The system 780 can include a memory device 700, a power source 782, a driver 784, a processor 786, and/or other subsystems or components 788. The memory device 700 can include features generally similar to those of the memory device described above with reference to FIGS. 1-6, and can therefore include various features for performing a direct read request from a host device. The resulting system 780 can perform any of a wide variety of functions, such as memory storage, data processing, and/or other suitable functions. Accordingly, representative systems 780 can include, without limitation, hand-held devices (e.g., mobile phones, tablets, digital readers, and digital audio players), computers, vehicles, appliances and other products. Components of the system 780 may be housed in a single unit or distributed over multiple, interconnected units (e.g., through a communications network). The components of the system 780 can also include remote devices and any of a wide variety of computer readable media.

From the foregoing, it will be appreciated that specific embodiments of the technology have been described herein for purposes of illustration, but that various modifications may be made without deviating from the disclosure. In addition, certain aspects of the new technology described in the context of particular embodiments may also be combined or eliminated in other embodiments. Moreover, although advantages associated with certain embodiments of the new technology have been described in the context of those embodiments, other embodiments may also exhibit such advantages and not all embodiments need necessarily exhibit such advantages to fall within the scope of the technology. Accordingly, the disclosure and associated technology can encompass other embodiments not expressly shown or described herein.

In the illustrated embodiments above, the memory devices have been described in the context of devices incorporating NAND-based non-volatile storage media (e.g., NAND flash). Memory devices configured in accordance with other embodiments of the present technology, however, can include other types of suitable storage media in addition to or in lieu of NAND-based storage media, such as NOR-based storage media, magnetic storage media, phase-change storage media, ferroelectric storage media, etc.

The term "processing" as used herein includes manipulating signals and data, such as writing or programming, reading, erasing, refreshing, adjusting or changing values, calculating results, executing instructions, assembling, transferring, and/or manipulating data structures. The term data structures includes information arranged as bits, words or code-words, blocks, files, input data, system generated data, such as calculated or generated data, and program data. Further, the term "dynamic" as used herein describes processes, functions, actions or implementation occurring during operation, usage or deployment of a corresponding device, system or embodiment, and after or while running manufacturer's or third-party firmware. The dynamically occurring processes, functions, actions or implementations can occur after or subsequent to design, manufacture, and initial testing, setup or configuration.

The above embodiments are described in sufficient detail to enable those skilled in the art to make and use the embodiments. A person skilled in the relevant art, however, will understand that the technology may have additional embodiments and that the technology may be practiced without several of the details of the embodiments described above with reference to FIGS. 1-6.

From the foregoing, it will be appreciated that specific embodiments of the technology have been described herein for purposes of illustration, but that various modifications may be made without deviating from the disclosure. In addition, certain aspects of the new technology described in the context of particular embodiments may also be combined or eliminated in other embodiments. Moreover, although advantages associated with certain embodiments of the new technology have been described in the context of those embodiments, other embodiments may also exhibit such advantages and not all embodiments need necessarily exhibit such advantages to fall within the scope of the technology. Accordingly, the disclosure and associated technology can encompass other embodiments not expressly shown or described herein.

We claim:

1. A memory device, comprising:
   active circuitry configured to process a segment set that corresponds to a source data, wherein:
   the source data comprises information corresponding to a device operation, the source data having a block length representing a number of bits therein, and
   the segment set includes at least a first segment and a second segment, the first segment and the second segment each including number of bits less than the block length; and
   a set of die pads coupled to the active circuitry and configured to communicate the segment set for operating a second device, wherein the set includes a number of die pads less than the block length.

2. The memory device of claim 1, wherein the active circuitry is configured to process based on generating the segment set based on dividing the source data into segments.

3. The memory device of claim 2, wherein the active circuitry is configured to process based on generating the segment set based on dividing the source data into n number of segments, wherein each of the segments include a number of bits equal to or less than (the block length/n).

4. The memory device of claim 2, wherein:
the segment set includes two segments, wherein the first segment includes the first four bits of the source data and the second segment includes the next four bits of the source data; and
the set of die pads includes four die pads configured to communicate the segment set.

5. The memory device of claim 2, wherein:
the segment set includes two segments, wherein the first segment includes the first eight bits of the source data and the second segment includes the next eight bits of the source data; and
the set of die pads includes eight die pads configured to communicate the segment set.

6. The memory device of claim 1, wherein:
the active circuitry and the set of die pads comprise a first die;
further comprising:
a second die coupled to the first die, the second die configured to:
communicate the segment set with the first die, and
process the segment set according to the device operation.

7. The memory device of claim 6, further comprising a set of inter-die connectors electrically coupling the first die and the second die through the die pads, wherein the set includes a number of inter-die connectors less than the block length.

8. The memory device of claim 6, wherein:
the second die is a target die configured to perform a write operation; and
the first die is a master die configured to:
process based on generating the segment set including at least a first write segment and a second write segment, and
send the segment set to the second die.

9. The memory device of claim 8, wherein the target die is further configured to:
generate a data write output based on recombining segments within the segment set;
store the data write output in completing the write operation.

10. The memory device of claim 8, wherein the master die includes a data latch configured to:
receive the source data from an external device;
generate the segment set based on dividing the source data into segments; and
store at least the second segment while sending the first segment to the target die.

11. The memory device of claim 6, wherein:
the device operation is a read operation;
the first die is a target die configured to:
process based on generating the segment set including at least a first read segment and a second read segment, and
send the segment set to the second die; and
the second die is a master die configured to generate a combined read output based on combining segments in the segment set, wherein the combined read output matches the source data.

12. The memory device of claim 11, wherein:
the target die is further configured to retrieve the source data for performing a read operation; and
the master die is further configured to send the combined read output to an external device for the read operation.

13. The memory device of claim 11, wherein the master die includes a data latch configured to store the first segment while receiving one or more remaining segments within the segment set.

14. The memory device of claim 6, wherein the first die and the second die are configured to simultaneously, in parallel, communicate content bits of each segments in the segment set.

15. The memory device of claim 6, wherein the first die and the second die are configured to sequentially, in series, communicate segments in the segment set.

16. The memory device of claim 15, wherein the first die is configured to:
send a first timing signal to the second die, wherein the first timing signal corresponds to the first segment; and
send a second timing signal to the second die after the first timing signal, wherein the second timing signal corresponds to the second segment.

17. The memory device of claim 1, wherein the segment set further includes a CRC segment representing information configured to validate the source data.

18. A method of operating a memory device, the method comprising:
processing a segment set that corresponds to a source data, wherein:
the source data comprises information corresponding to a device operation, the source data having a block length representing a number of bits therein, and
the segment set including at least a first segment and a second segment, the first segment and the second segment having a number of bits less than the block length; and
communicating the segment set with the second die using a number of connectors for further processing the source data at a second device according to the device operation, wherein the number is less than the block length.

19. The method of claim 18, wherein:
processing the segment set includes dividing the source data into n number of segments, wherein each of the segments include (the block length/n) bits or less; and
communicating the segment set includes communicating the segment set using (the block length/n) number of connectors, wherein each connector corresponds to one of the content bits of each segment.

20. The method of claim 18, wherein:
processing the segment set includes generating, at a master die, at least a first write segment and a second write segment for a write operation; and
further comprising:
storing the first write segment, the second write segment, or a combination thereof at the second device, wherein the second device is a target die for the write operation.

21. The method of claim 18, wherein:
processing the segment set includes generating, at a target die, at least a first read segment and a second read segment for a read operation; and
further comprising:
retrieving, using the target die, the first read segment, the second read segment, or a combination thereof using the target die;

generating a combined read output based on combining segments in the segment set, wherein the combined read output matches the source data; and sending the combined read output to an external device for the read operation.

22. The method of claim 18, wherein communicating the segment set includes:

simultaneously sending, in parallel, content bits of the first segment; and after sending the first segment, simultaneously sending, in parallel, content bits of the second segment.

23. The method of claim 18, wherein communicating the segment set includes:

sending a first timing signal to the second die, wherein the first timing signal corresponds to the first segment; and sending a second timing signal to the second die after the first timing signal, wherein the second timing signal corresponds to the second segment.

\* \* \* \* \*